(12) United States Patent
Nakamura (10) Patent No.: US 10,913,356 B2
(45) Date of Patent: Feb. 9, 2021

(54) POWER SUPPLY SYSTEM (71) Applicant: TOYOTA JIDOSHA KABUSHIKI KAISHA, Toyota (JP)

(72) Inventor: Keiichi Nakamura, Toyota (JP)

(73) Assignee: TOYOTA JIDOSHA KABUSHIKI KAISHA, Toyota (JP)

(*) Notice: Subject to any disclaimer, the term of this patent is extended or adjusted under 35 U.S.C. 154(b) by 462 days.

(21) Appl. No.: 15/882,403

(22) Filed: Jan. 29, 2018

(65) Prior Publication Data
US 2018/0219407 A1 Aug. 2, 2018

(30) Foreign Application Priority Data

Jan. 31, 2017 (JP) .................... 2017-016056

(51) Int. Cl.
*B62D 5/04* (2006.01)
*H02J 7/34* (2006.01)
(Continued)

(52) U.S. Cl.
CPC ............ *B60L 1/00* (2013.01); *B60L 3/0046* (2013.01); *B60L 3/0092* (2013.01); *B60L 3/04* (2013.01);
(Continued)

(58) Field of Classification Search
CPC ...... H02J 7/34; H02J 1/08; H02J 1/082; H02J 7/1492; H02J 7/1461; H02J 7/1423; H02J 2310/46; H02J 2310/48; B60L 3/0046; B60L 1/00; B60L 3/0092; B60L 2240/547; B60L 58/10; B60R 16/03; B60R 3/04; B60R 58/20; B60R 16/033; G01R 31/382; G01R 31/389; G01R 31/392;
(Continued)

(56) References Cited

U.S. PATENT DOCUMENTS 9,963,166 B2* 5/2018 Xu .................. B62D 5/046
2017/0106899 A1* 4/2017 Xu .................. B60L 1/00
(Continued)

FOREIGN PATENT DOCUMENTS

DE 102005004330 A1 8/2006
DE 102014208192 A1 11/2015
(Continued)

*Primary Examiner* — Jared Fureman
*Assistant Examiner* — Michael J Warmflash
(74) *Attorney, Agent, or Firm* — Hunton Andrews Kurth LLP (57) ABSTRACT

A power supply system includes a first circuit, a second circuit and a voltage controller. The first circuit includes a first power supply line connected to each of a first load, a power supply source, and a first battery. The second circuit includes a second power supply line connected to a second load and a second battery connected to the second power supply line. The voltage controller includes a DC-DC converter connected between the first power supply line and the second power supply line. The second load is able to perform a function that substitutes for at least part of a function that the first load performs. The voltage controller includes a converter control unit configured to control the DC-DC converter such that an output voltage higher than or equal to a voltage of the second battery is output to the second power supply line.

12 Claims, 5 Drawing Sheets

(51) Int. Cl.
    *H02M 3/155*     (2006.01)
    *B60L 1/00*     (2006.01)
    *G01R 31/382*     (2019.01)
    *G01R 31/389*     (2019.01)
    *G01R 31/392*     (2019.01)
    *B60L 3/00*     (2019.01)
    *H02J 1/08*     (2006.01)
    *B60R 16/03*     (2006.01)
    *B60L 3/04*     (2006.01)
    *B60L 58/20*     (2019.01)
    *H02J 7/14*     (2006.01)

(52) U.S. Cl.
    CPC .............. *B60L 58/20* (2019.02); *B60R 16/03* (2013.01); *B62D 5/0484* (2013.01); *G01R 31/382* (2019.01); *G01R 31/389* (2019.01); *G01R 31/392* (2019.01); *H02J 1/08* (2013.01); *H02J 7/34* (2013.01); *H02M 3/155* (2013.01); *B60L 2240/547* (2013.01); *H02J 1/082* (2020.01); *H02J 7/1423* (2013.01); *H02J 7/1461* (2013.01); *H02J 7/1492* (2013.01); *Y02T 10/70* (2013.01); *Y02T 10/92* (2013.01)

(58) Field of Classification Search
    CPC ... G01R 31/006; B62D 5/0484; H02M 3/155; H02M 3/00; Y02T 10/92; Y02T 10/7066; Y02T 10/7005
    See application file for complete search history.

(56) References Cited

U.S. PATENT DOCUMENTS

2017/0113637 A1     4/2017     Mueller et al.
2018/0001850 A1     1/2018     Kontani

FOREIGN PATENT DOCUMENTS

| | | | |
|---|---|---|---|
| DE | 102015200124 A1 * | 7/2016 | ............ H02J 9/06 |
| DE | 102015200124 A1 | 7/2016 | |
| JP | 2007-131134 A | 5/2007 | |
| JP | 2008-296797 A | 12/2008 | |
| JP | 2015-020619 A | 2/2015 | |
| JP | 2015209013 A | 11/2015 | |
| WO | 2016110353 A1 | 7/2016 | |
| WO | 2016111340 A1 | 7/2016 | |

* cited by examiner

POWER SUPPLY SYSTEM

INCORPORATION BY REFERENCE

The disclosure of Japanese Patent Application No. 2017-016056 filed on Jan. 31, 2017 including the specification, drawings and abstract is incorporated herein by reference in its entirety.

BACKGROUND

1. Technical Field

The disclosure relates to a power supply system.

2. Description of Related Art

There is known a vehicle power supply system including a converter connected between one power line and the other power line (see, for example, Japanese Patent Application Publication No. 2007-131134 (JP 2007-131134 A)). In this vehicle power supply system, an alternator, a lead-acid battery and a load, such as an audio device, are connected to the one power line, and a lithium-ion battery and a load, such as an electric power steering system, are connected to the other power line.

SUMMARY

As in the case of the above-described technique, there is a power supply system that is mounted on a vehicle and in which a first circuit including a first power supply line and a second circuit including a second power supply line are connected to each other via a direct current to direct current converter (hereinafter, referred to as a DC-DC converter). A first load, a power supply source and a first battery are connected to the first power supply line, and a second load and a second battery are connected to the second power supply line. In the thus configured power supply system, the second battery of the second circuit is charged with electric power that is supplied from the power supply source of the first circuit via the DC-DC converter.

In addition, with the above configuration, if the first load and the second load each have the function of backing up the other one, the function of the first load is backed up by the function of the second load even when the first load malfunctions because of an abnormality in the first circuit.

However, when the voltage of the first power supply line becomes lower than the voltage of the second battery, the electric charge of the second battery can migrate to the first power supply line via the DC-DC converter, and the amount of electric charge stored in the second battery can reduce. If there occurs an abnormality in the first circuit in a state where the amount of electric charge stored in the second battery has reduced in this way, there can be a case where electric power for actuating the second load cannot be ensured by the second battery in the event of an abnormality in the first circuit. In this case, for example, even when the first load malfunctions because of an abnormality in the first circuit, the function of the first load may not be backed up by the function of the second load.

An aspect of the disclosure provides a power supply system that is able to prevent a stop of supply of electric power for actuating a second load from a second battery in the event of an abnormality in a first circuit.

An aspect of the disclosure provides a power supply system. The power supply system includes a first circuit including a first power supply line connected to a first load, a power supply source connected to the first power supply line, and a first battery connected to the first power supply line; a second circuit including a second power supply line connected to a second load and a second battery connected to the second power supply line, the second load being configured to perform a function that substitutes for a function performed by the first load; and a voltage controller including a converter control unit and a DC-DC converter, the DC-DC converter being connected between the first power supply line and the second power supply line, the converter control unit being configured to control the DC-DC converter by using an input voltage from the first power supply line such that an output voltage higher than or equal to a voltage of the second battery is output to the second power supply line.

With the thus configured power supply system, the DC-DC converter is controlled by using the input voltage from the first power supply line such that the output voltage higher than or equal to the voltage of the second battery is output to the second power supply line. Therefore, even when the voltage of the first power supply line becomes lower than the voltage of the second battery, the voltage of the second power supply line is kept at a voltage higher than or equal to the voltage of the second battery through control over the DC-DC converter. For this reason, even when the voltage of the first power supply line becomes lower than the voltage of the second battery, it is possible to prevent migration of the electric charge of the second battery to the first power supply line via the DC-DC converter. Thus, it is possible to prevent a reduction in the amount of electric charge stored in the second battery before there occurs an abnormality in the first circuit, so electric power for actuating the second load at the time when there occurs an abnormality in the first circuit is ensured by the second battery. As a result, even when the first load malfunctions because of an abnormality in the first circuit, the function of the first load is backed up by the function of the second load.

In the power supply system according to the aspect of the disclosure, the voltage controller may include a first abnormality detection unit configured to detect an abnormality of the first circuit. The converter control unit may be configured to, when the abnormality of the first circuit has not been detected by the first abnormality detection unit, control the DC-DC converter by using the input voltage from the first power supply line such that the output voltage higher than or equal to the voltage of the second battery is output to the second power supply line from the DC-DC converter, and the converter control unit may be configured to, when the abnormality of the first circuit has been detected by the first abnormality detection unit, control the DC-DC converter such that the first power supply line is interrupted from the second power supply line.

Thus, when there is no abnormality in the first circuit, even when the voltage of the first power supply line becomes lower than the voltage of the second battery, the voltage of the second power supply line is kept at a voltage higher than or equal to the voltage of the second battery through control over the DC-DC converter. Therefore, as in the case of the above, it is possible to prevent a reduction in the amount of electric charge stored in the second battery before there occurs an abnormality in the first circuit, so electric power for actuating the second load at the time when there occurs an abnormality in the first circuit is ensured by the second battery. On the other hand, when there occurs an abnormality in the first circuit, the DC-DC converter is controlled such that the first power supply line is interrupted from the second power supply line. Thus, it is possible to stop flow of current between the first power supply line and the second power supply line via the DC-DC converter, so it is possible to prevent the influence of an abnormality of the first circuit on the second circuit.

In the power supply system according to the aspect of the disclosure, the converter control unit may be configured to, when a first under voltage fault in which a voltage of the first power supply line becomes lower than the voltage of the second battery has been detected by the first abnormality detection unit, control the DC-DC converter such that the first power supply line is interrupted from the second power supply line.

Thus, even when there occurs the first under voltage fault in which the voltage of the first power supply line becomes lower than the voltage of the second battery, it is possible to prevent migration of the electric charge of the second battery to the first power supply line via the DC-DC converter. Therefore, it is possible to reduce the degree to which the amount of electric charge stored in the second battery reduces after occurrence of the first under voltage fault. As a result, it is possible to extend a time during which electric power for actuating the second load at the time when there occurs an abnormality in the first circuit is ensured by the second battery. In addition, even when the first load malfunctions because of an abnormality in the first circuit, it is possible to extend a time during which the function of the first load is backed up by the function of the second load.

Specific examples of the first under voltage fault in which the voltage of the first power supply line becomes lower than the voltage of the second battery include a ground short circuit of the first power supply line, an internal short circuit of the first load, and the like.

The power supply system according to the aspect of the disclosure may include a third power supply line connected between a third load and a node located between the second battery and the second power supply line; and a first interrupting mechanism connected between the node and the second power supply line. The converter control unit may be configured to, when the abnormality of the first circuit has been detected by the first abnormality detection unit, control the first interrupting mechanism such that the node is interrupted from the second power supply line before electric power for actuating the third load from the second battery becomes empty.

Thus, when there is an abnormality in the first circuit, the first interrupting mechanism is controlled such that the node is interrupted from the second power supply line before electric power for actuating the third load from the second battery becomes empty. Therefore, before all the electric power of the second battery is consumed as electric power for actuating the second load, electric power for actuating the third load is ensured by the second battery. As a result, it is possible to extend the operating time of the third load as compared to the second operating time. This is particularly effective when the third load is more important than the second load.

In the power supply system according to the aspect of the disclosure, the power supply system may be mounted on a vehicle, and the third load may be include a steering controller configured to control a wheel steering angle of the vehicle by steer-by-wire.

Thus, even when there is an abnormality in the first circuit, it is possible to particularly extend the operating time of the steering controller, so it becomes easier to ensure a time for moving the vehicle to a safe place.

In the power supply system according to the aspect of the disclosure, the voltage controller may include a second abnormality detection unit configured to detect an abnormality of the second circuit, and the converter control unit may be configured to, when the abnormality of the second circuit has been detected by the second abnormality detection unit, control the DC-DC converter such that the first power supply line is interrupted from the second power supply line.

Thus, when there occurs an abnormality in the second circuit, the DC-DC converter is controlled such that the first power supply line is interrupted from the second power supply line. Therefore, it is possible to stop flow of current between the first power supply line and the second power supply line via the DC-DC converter, so it is possible to prevent the influence of an abnormality of the second circuit on the first circuit.

In the power supply system according to the aspect of the disclosure, the converter control unit may be configured to, when a second under voltage fault in which a voltage of the second power supply line becomes lower than a voltage of the first battery has been detected by the first abnormality detection unit, control the DC-DC converter such that the first power supply line is interrupted from the second power supply line.

Thus, even when there occurs the second under voltage fault in which the voltage of the second power supply line becomes lower than the voltage of the first battery, it is possible to prevent migration of electric power from the power supply source and the electric charge of the first battery to the second power supply line via the DC-DC converter. Therefore, it is possible to reduce the degree to which the amount of electric charge stored in the first battery reduces after occurrence of the second under voltage fault. As a result, it is possible to extend a time during which electric power for actuating the first load at the time when there occurs an abnormality in the second circuit is ensured by the first battery. In addition, even when the second load malfunctions because of an abnormality in the second circuit, it is possible to extend a time during which the function of the second load is backed up by the function of the first load.

Specific examples of the second under voltage fault in which the voltage of the second power supply line becomes lower than the voltage of the first battery include a ground short circuit of the second power supply line, an internal short circuit of the second load, and the like.

In the power supply system according to the aspect of the disclosure, the output voltage may be higher than or equal to the voltage of the second battery in a full charge state.

Thus, even when the voltage of the first power supply line becomes lower than the voltage of the second battery, the voltage of the second power supply line is kept at a voltage higher than or equal to the voltage of the second battery in a full charge state through control over the DC-DC converter. Therefore, the amount of electric charge stored in the second battery is allowed to be kept in a full charge state before there occurs an abnormality in the first circuit, so the second battery becomes easier to ensure electric power for actuating the second load at the time when there occurs an abnormality in the first circuit.

The power supply system according to the aspect of the disclosure may include a battery sensor configured to monitor the second battery; and a degradation detection unit configured to detect degradation of the second battery. The voltage controller may include a first internal resistance estimation unit configured to estimate an internal resistance of the second battery by stepping up and stepping down the voltage of the second battery. The battery sensor may include a second internal resistance estimation unit configured to estimate an internal resistance of the second battery by causing the second battery to perform pulse discharge. The degradation detection unit may be configured to detect degradation of the second battery based on the internal resistance estimated by the first internal resistance estimation unit and the internal resistance estimated by the second internal resistance estimation unit.

Thus, both the internal resistance estimated by the first internal resistance estimation unit and the internal resistance estimated by the second internal resistance estimation unit are considered in order to detect degradation of the second battery, so the accuracy of detecting degradation of the second battery improves.

In the power supply system according to the aspect of the disclosure, the first load and the second load each may be configured to back up the other one by performing the same function as a function that the other one performs.

Thus, even when a predetermined function of the first load malfunctions because of an abnormality in the first circuit, it is possible to back up the predetermined function of the first load by using the function of the second load, which is the same as the predetermined function. On the other hand, even when a predetermined function of the second load malfunctions because of an abnormality in the second circuit, it is possible to back up the predetermined function of the second load by using the function of the first load, which is the same as the predetermined function.

In the power supply system according to the aspect of the disclosure, the power supply system may be mounted on a vehicle, and the first load and the second load each may have a motion control function associated with control over a motion of the vehicle, and each may be configured to back up the motion control function that the other one performs.

Thus, even when the motion control function of the first load malfunctions because of an abnormality in the first circuit, it is possible to back up the motion control function of the first load by using the motion control function of the second load. On the other hand, even when the motion control function of the second load malfunctions because of an abnormality in the second circuit, it is possible to back up the motion control function of the second load by using the motion control function of the first load.

The motion of the vehicle may mean at least one motion of the vehicle among running, turning and stopping.

In the power supply system according to the aspect of the disclosure, the DC-DC converter may be configured to output the output voltage to the second power supply line in accordance with control that is executed by the converter control unit.

In the power supply system according to the aspect of the disclosure, the first load and the second load each may have a function of backing up a function of the other one.

According to the aspect of the disclosure, it is possible to prevent a stop of supply of electric power for actuating the second load from the second battery in the event of an abnormality in the first circuit.

BRIEF DESCRIPTION OF THE DRAWINGS

Features, advantages, and technical and industrial significance of exemplary embodiments of the disclosure will be described below with reference to the accompanying drawings, in which like numerals denote like elements, and wherein.

DETAILED DESCRIPTION OF EMBODIMENTS

Hereinafter, an embodiment of the disclosure will be described with reference to the accompanying drawings.

Figure 1:
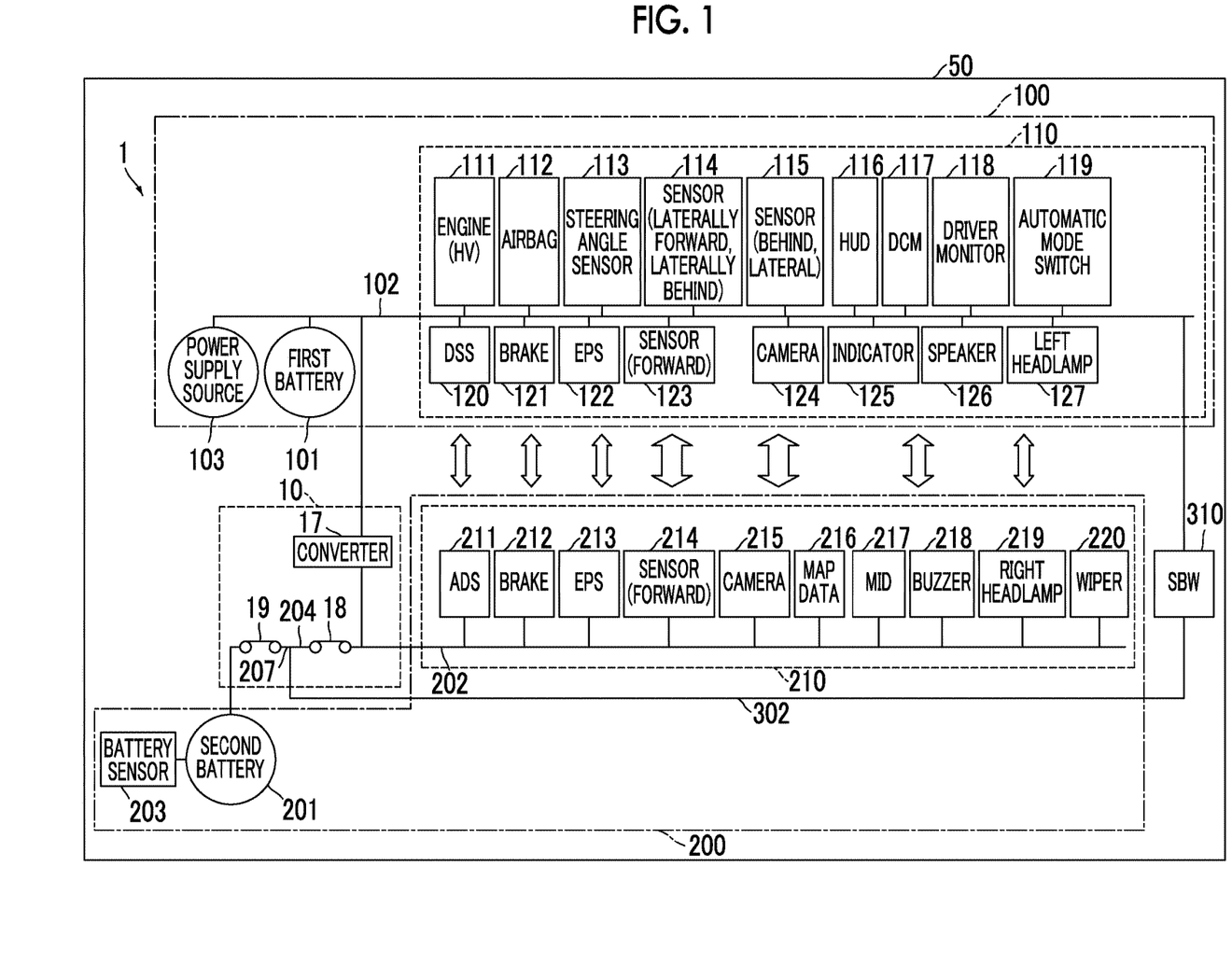
FIG. 1 is a view that shows an example of the configuration of a power supply system.

FIG. 1 is a view that shows an example of the configuration of a power supply system. The power supply system 1 shown in FIG. 1 is an example of a power supply system that is mounted on a vehicle 50. The power supply system 1 includes a circuit 100, a circuit 200, a voltage controller 10, a load 310 and a power supply line 302.

The circuit 100 is an example of a first circuit. The circuit 100 includes a load group 110, a power supply line 102, a power supply 103 and a battery 101. The load group 110 includes a plurality of loads 111 to 127.

The load 111 is an engine electronic control unit (ECU) that governs engine control over the vehicle 50. When the vehicle 50 is a hybrid vehicle that uses both an engine and a motor, the load 111 includes both the engine ECU and an HVECU that governs hybrid control.

The load 112 is an airbag ECU that controls deployment of an airbag of the vehicle 50.

The load 113 is a steering angle sensor that detects the steering angle of the wheels of the vehicle 50.

The load 114 includes at least one of a sensor that detects a surrounding object located laterally forward of the vehicle 50 and a sensor that detects a surrounding object located laterally behind the vehicle 50.

The load 115 includes at least one of a sensor that detects a surrounding object located behind the vehicle 50 and a sensor that detects a surrounding object located laterally to the vehicle 50.

The load 116 is a head up display (HUD) that shows information in the field of view of a driver who drives the vehicle 50.

The load 117 is a data communication module (DCM) that wirelessly communicates with a device outside of the vehicle 50.

The load 118 is a driver monitoring device that monitors the driver of the vehicle 50.

The load 119 is an automatic mode switch that switches between the on and off states of an automatic drive mode of the vehicle 50.

The load 120 is a driver support ECU that controls a driver support system (DSS). The DSS supports driver's driving of the vehicle 50 with the use of an automatic brake, an alarm, and the like.

The load 121 is a brake control system that controls the brake force of the vehicle 50.

The load 122 is a system (electronic power steering (EPS)) that supports the steering operation of the driver of the vehicle 50 with the use of a motor.

The load 123 is a sensor that detects a surrounding object located forward of the vehicle 50.

The load 124 is a camera that captures a surrounding object located forward of the vehicle 50.

The load 125 is an indicator that informs the driver of the vehicle 50 of a predetermined vehicle state of the vehicle 50 through a lamp, and, for example, includes a check engine lamp, a brake alarm lamp, and the like.

The load 126 is a speaker that outputs sound, such as alarm sound and voice, toward the driver of the vehicle 50.

The load 127 is a headlamp installed at the front left side of the vehicle 50.

The power supply line 102 is an example of a first power supply line, and is a current path connected to the loads 111 to 127. The power supply line 102 is, for example, a 12V power supply line.

The power supply 103 is an example of a power supply source, and is connected to the power supply line 102. The power supply 103 supplies electric power to the battery 101, the load group 110 and the voltage controller 10. The power supply 103 supplies electric power to the load 310 via the power supply line 102. The power supply 103 is able to supply electric power to the circuit 200 and the load 310 via a converter 17 when the converter 17 is controlled. Specific examples of the power supply 103 include an alternator, a converter (another converter different from the converter 17), and the like.

The battery 101 is an example of a first battery, and is connected to the power supply line 102. The battery 101 is a secondary battery that is rechargeable when supplied with electric power. A specific example of the battery 101 is a lead-acid battery. In a state where the output voltage of the power supply 103 is lower than the battery voltage of the battery 101, the battery 101 serves as a power supply that supplies electric power to the load group 110, the voltage controller 10 and the load 310. In a state where the output voltage of the power supply 103 is lower than the battery voltage of the battery 101, the battery 101 is able to supply electric power to the circuit 200 and the load 310 via the converter 17 when the converter 17 is controlled.

The circuit 200 is an example of a second circuit. The circuit 200 includes a load group 210, a power supply line 202, a battery 201 and a battery sensor 203. The load group 210 includes a plurality of loads 211 to 220.

The load 211 is an automatic drive ECU that controls an automatic drive system (ADS). The ADS controls the automatic drive of the vehicle 50 with the use of the automatic brake, an automatic steering, and the like.

The load 212 is a brake control system that controls the brake force of the vehicle 50.

The load 213 is a system (electronic power steering (EPS)) that supports the steering operation of the driver of the vehicle 50 with the use of a motor.

The load 214 is a sensor that detects a surrounding object located forward of the vehicle 50.

The load 215 is a camera that captures a surrounding object around the vehicle 50.

The load 216 is a map data storage unit that stores map data.

The load 217 is a display (multi-information display (MID)) that informs the driver of the vehicle 50 of predetermined information of the vehicle 50 through screen display.

The load 218 is a buzzer that sounds an alarm sound for the driver of the vehicle 50.

The load 219 is a headlamp installed at the front right side of the vehicle 50.

The load 220 is a wiper that wipes the windshield of the vehicle.

The power supply line 202 is an example of a second power supply line, and is a current path connected to the loads 211 to 220. The power supply line 202 is, for example, a 12V power supply line that carries the same voltage as the power supply line 102.

The battery 201 is an example of a second battery, and is connected to the power supply line 202. The battery 201 supplies electric power to the load group 210 and the voltage controller 10. The battery 201 supplies electric power to the load 310 via the power supply line 302. The battery 201 is a secondary battery that is rechargeable when supplied with electric power. A specific example of the battery 201 is a lead-acid battery.

The battery sensor 203 monitors the battery 201, and outputs the monitored result to the voltage controller 10. For example, the battery sensor 203 estimates the internal resistance of the battery 201 by measuring the battery voltage and battery current of the battery 201 at the time when the battery 201 is caused to perform pulse discharge, and outputs the estimated result to the voltage controller 10.

The voltage controller 10 is an example of a device that controls voltage conversion between the power supply line 102 and the power supply line 202. The voltage controller 10 includes the converter 17, a relay 18 and a relay 19.

The converter 17 is an example of a DC-DC converter. The converter 17 is connected between the power supply line 102 and the power supply line 202, and carries out DC-DC voltage conversion between the power supply line 102 and the power supply line 202.

The relay 18 is an example of a first interrupting mechanism connected between a node 207 and the power supply line 202. The node 207 represents a connection point at which a battery line 204 and the power supply line 302 are connected to each other. The battery line 204 is a current path between the power supply line 202 and the battery 201. The relay 18 is serially inserted in the battery line 204 so as to be able to interrupt the node 207 from the power supply line 202.

The relay 19 is an example of a second interrupting mechanism connected between the node 207 and the battery 201. The relay 19 is serially inserted in the battery line 204 so as to be able to interrupt the node 207 from the battery 201.

The load 310 includes a steering controller that controls the wheel steering angle of the vehicle 50 by steer-by-wire. The steering controller is a system that controls the wheel steering angle of the vehicle 50 in a steer-by-wire system that performs not mechanical transmission but electrical transmission between the shaft of a steering wheel and a wheel steering shaft. The load 310 may include a load other than the steering controller.

The power supply line 302 is an example of a third power supply line, and is a current path connected between the node 207 and the load 310. The power supply line 302 is, for example, a 12V power supply line that carries the same voltage as the power supply line 202.

Each of the loads 120 to 127 is an example of a first load. Each of the loads 211 to 219 is an example of a second load. The load 310 is an example of a third load.

The load 120 and the load 211 each backs up the function of the other one by using a similar function to the function of the other one. The load 120 is an example of a load that backs up the function of the load 211 by using a similar function to the function of the load 211. The load 211 is an example of a load that backs up the function of the load 120 by using a similar function to the function of the load 120. The load 120 and the load 211 have a similarity in supporting the driver, but differ from each other in the manner of supporting.

The load 121 and the load 212 each back up the function of the other one by using the same function as the function of the other one. The load 121 is an example of a load that backs up the function of the load 212 by using the same function as the function of the load 212. The load 212 is an example of a load that backs up the function of the load 121 by using the same function as the function of the load 121. The load 121 and the load 212 have the same function of controlling the brake force of the vehicle 50 in the same manner. For example, the share of each of the load 121 and the load 212 is 50% of the total brake force that is required of the vehicle 50.

The load 122 and the load 213 each back up the function of the other one by using the same function as the function of the other one. The load 122 is an example of a load that backs up the function of the load 213 by using the same function as the function of the load 213. The load 213 is an example of a load that backs up the function of the load 122 by using the same function as the function of the load 122. The load 122 and the load 213 have the same function of supporting the steering operation of the driver of the vehicle 50 with the use of the motor in the same manner. For example, the share of each of the load 122 and the load 213 is 50% of the total output that is required to support the steering operation.

The load 123 and the load 214 each back up the function of the other one by using the same function as the function of the other one. The load 123 is an example of a load that backs up the function of the load 214 by using the same function as the function of the load 214. The load 214 is an example of a load that backs up the function of the load 123 by using the same function as the function of the load 123. The load 123 and the load 214 have a commonality in detecting a surrounding object located forward of the vehicle 50.

The load 124 and the load 215 each back up the function of the other one by using a similar function to the function of the other one. The load 124 is an example of a load that backs up the function of the load 215 by using a similar function to the function of the load 215. The load 215 is an example of a load that backs up the function of the load 124 by using a similar function to the function of the load 124. The load 124 and the load 215 have a similarity in capturing a surrounding object around the vehicle 50 but differ from each other in the manner of capturing.

The load 125 and the load 217 each back up the function of the other one by using a similar function to the function of the other one. The load 125 is an example of a load that backs up the function of the load 217 by using a similar function to the function of the load 217. The load 217 is an example of a load that backs up the function of the load 125 by using a similar function to the function of the load 125. The load 125 and the load 217 have a similarity in informing a vehicle state but differ from each other in the manner of informing.

The load 126 and the load 218 each back up the function of the other one by using a similar function to the function of the other one. The load 126 is an example of a load that backs up the function of the load 218 by using a similar function to the function of the load 218. The load 218 is an example of a load that backs up the function of the load 126 by using a similar function to the function of the load 126. The load 126 and the load 218 have a similarity in outputting sound but differ from each other in the manner of outputting sound.

The load 127 and the load 219 each back up the function of the other one by using the same function as the function of the other one. The load 127 is an example of a load that backs up the function of the load 219 by using the same function as the function of the load 219. The load 219 is an example of a load that backs up the function of the load 127 by using the same function as the function of the load 127. The load 127 and the load 219 have the same function of illuminating an area forward of the vehicle 50 in the same manner. For example, the load 127 illuminates an area on the left forward of the vehicle 50, and the load 219 illuminates an area on the right forward of the vehicle 50.

The "back up" means that, when one load malfunctions, the other load maintains the function of the one load.

Figure 2:
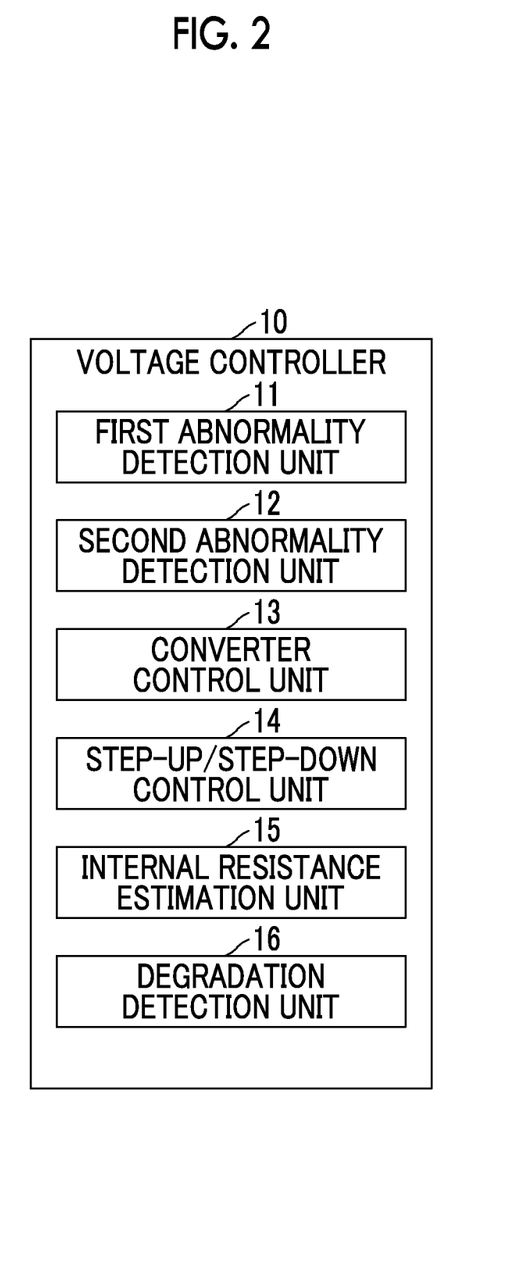
FIG. 2 is a view that shows an example of the functional configuration of a voltage controller.

FIG. 2 is a view that shows an example of the functional configuration of the voltage controller. The voltage controller 10 includes an abnormality detection unit 11, an abnormality detection unit 12, a converter control unit 13, a step-up/step-down control unit 14, an internal resistance estimation unit 15 and a degradation detection unit 16.

Figure 4:
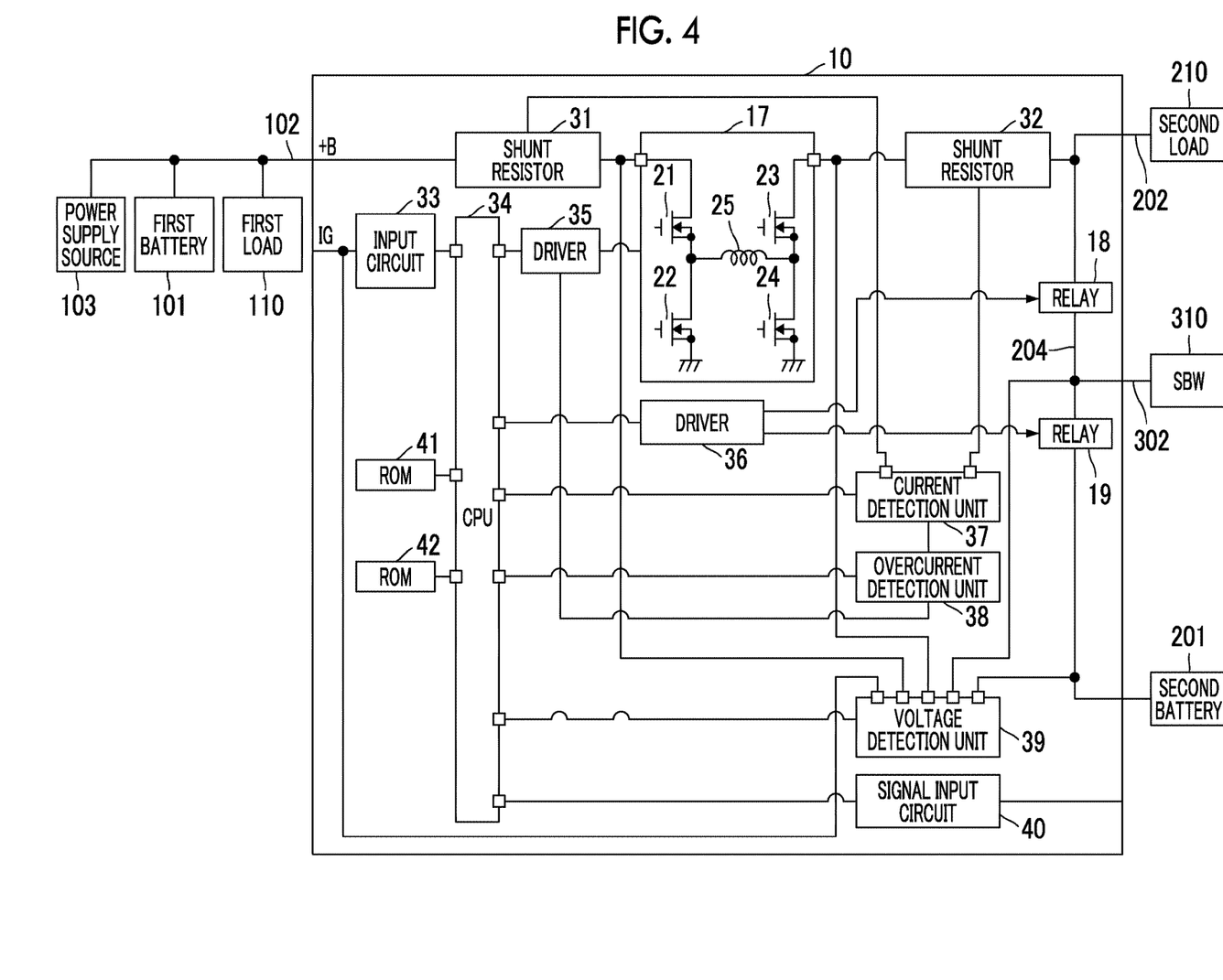
FIG. 4 is a view that shows an example of the hardware configuration of the voltage controller.

As shown in FIG. 4 (described later), the voltage controller 10 includes a central processing unit (CPU) 34 that is an example of a processor, a read only memory (ROM) 41 and a random access memory (RAM) 42. The processing functions of the abnormality detection unit 11, abnormality detection unit 12, converter control unit 13, step-up/step-down control unit 14, internal resistance estimation unit 15 and degradation detection unit 16 are implemented by the CPU 34 when the CPU 34 executes programs stored in the ROM 41. The programs include a program for causing the CPU 34 to execute the procedure of processes. The RAM 42 stores various data including intermediate data, and the like, in computation based on programs that the CPU 34 executes.

In FIG. 2, the abnormality detection unit 11 is an example of a first abnormality detection unit, and detects an abnormality (for example, first under voltage fault, or the like) of the voltage circuit 100. The abnormality detection unit 12 is an example of a second abnormality detection unit, and detects an abnormality (for example, second under voltage fault, or the like) of the circuit 200.

The converter control unit 13 is an example of a converter control unit. The converter control unit 13 controls the converter 17 by using an input voltage from the power supply line 102 such that an output voltage higher than or equal to the voltage of the battery 201 is output to the power supply line 202. When an abnormality has been detected by at least one of the abnormality detection units 11, 12, the converter control unit 13 controls the converter 17 such that the power supply line 102 is interrupted from the power supply line 202.

When no abnormality has been detected by any of the abnormality detection units 11, 12, the step-up/step-down control unit 14 controls stepping up and stepping down of the battery 201 in order to detect degradation of the battery 201. The internal resistance estimation unit 15 is an example of a first internal resistance estimation unit. The internal resistance estimation unit 15 estimates the internal resistance of the battery 201 by using Ohm's law by causing the step-up/step-down control unit 14 to step up and step down the battery 201. The degradation detection unit 16 detects degradation of the battery 201 on the basis of the estimated internal resistance of the battery 201.

Figure 3:
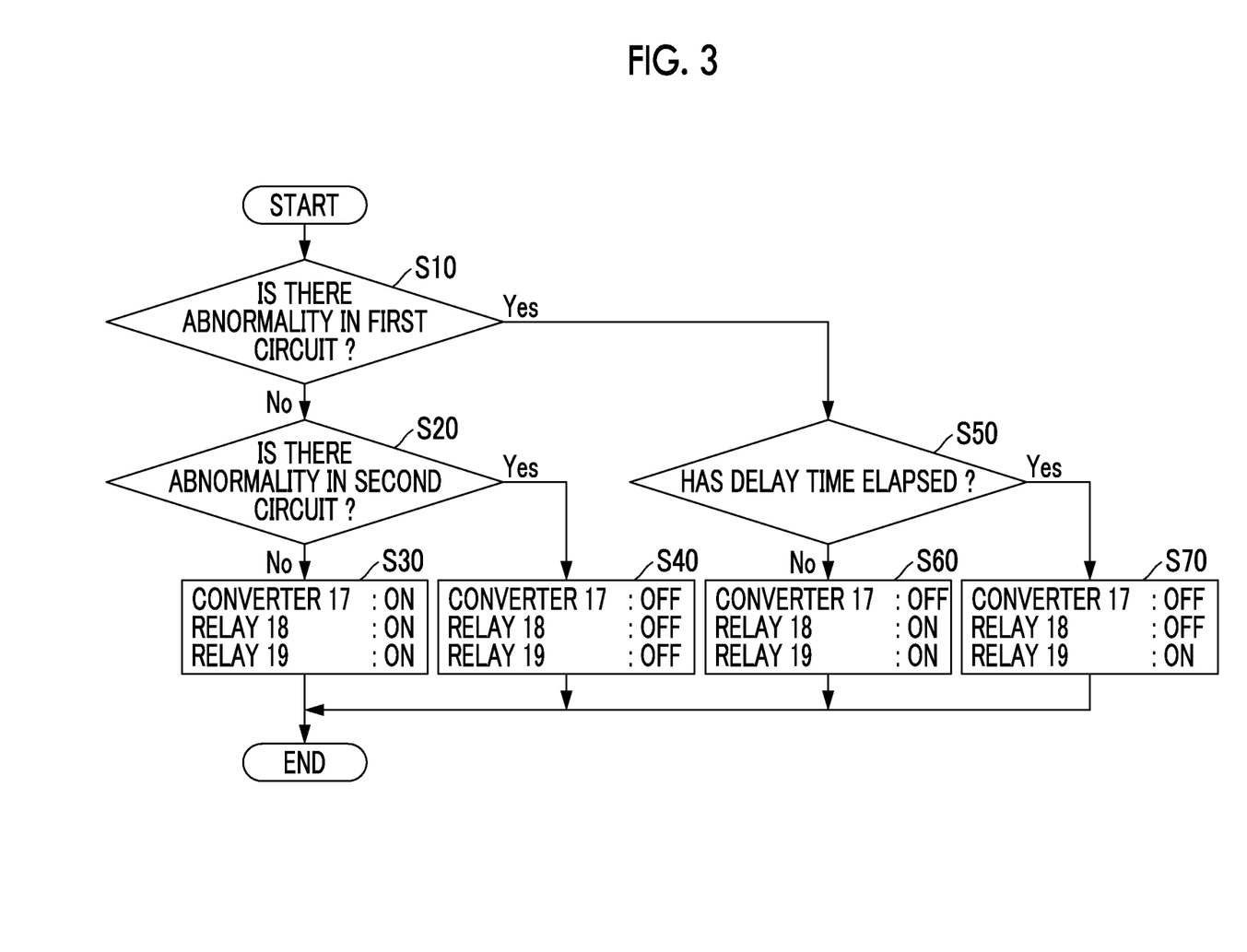
FIG. 3 is a flowchart that shows an example of the operation of the voltage controller.

FIG. 3 is a flowchart that shows an example of the operation of the voltage controller. The CPU 34 (see FIG. 4) executes the flow from START to END at predetermined intervals.

In step S10, the abnormality detection unit 11 determines whether an abnormality of the circuit 100 has been detected.

In step S20, the abnormality detection unit 12 determines whether an abnormality of the circuit 200 has been detected.

When neither an abnormality of the circuit 100 nor an abnormality of the circuit 200 has been detected, the converter control unit 13 turns on the converter 17, turns on the relay 18 and turns on the relay 19 (step S30). In step S30, the converter control unit 13 controls the converter 17 by using the input voltage from the power supply line 102 such that the output voltage higher than or equal to the voltage of the battery 201 is output to the power supply line 202.

As the converter 17 is controlled in this way, electric power is supplied from the power supply line 102 side to the power supply line 202 side, and the voltage of the power supply line 202 is kept at a voltage higher than or equal to the voltage of the battery 201. For this reason, after that, even when the voltage of the power supply line 102 becomes lower than the voltage of the battery 201, it is possible to prevent migration of the electric charge of the battery 201 to the power supply line 102 via the converter 17. Thus, it is possible to prevent a reduction in the amount of electric charge stored in the battery 201 before there occurs an abnormality in the circuit 100, so electric power for actuating the loads 211 to 219 at the time when there occurs an abnormality in the circuit 100 is ensured by the battery 201. As a result, even when the loads 120 to 127 malfunction because of an abnormality in the circuit 100, it is possible to back up the functions of the loads 120 to 127 by using the functions of the loads 211 to 219.

In step 30, for example, the output voltage higher than or equal to the voltage of the battery 201 (that is, the output voltage of the converter 17 to the power supply line 202) is higher than or equal to the voltage of the battery 201 in a full charge state. In step 30, the converter control unit 13 may control the converter 17 such that the output voltage higher than the voltage of the battery 201 is output to the power supply line 202. In this case, for example, the output voltage higher than the voltage of the battery 201 (that is, the output voltage of the converter 17 to the power supply line 202) may be higher than the voltage of the battery 201 in a full charge state.

Thus, even when the voltage of the power supply line 102 becomes lower than the voltage of the battery 201, the voltage of the power supply line 202 is kept at a voltage higher than or equal to the voltage of the battery 201 in a full charge state through control over the converter 17. Therefore, the amount of electric charge stored in the battery 201 is allowed to be kept in a full charge state before there occurs an abnormality in the circuit 100, so electric power for actuating the loads 211 to 219 is more easily ensured by the battery 201 at the time when there occurs an abnormality in the circuit 100.

When an abnormality of the circuit 100 has not been detected but an abnormality of the circuit 200 has been detected in step S20, the converter control unit 13 turns off the converter 17, turns off the relay 18 and turns off the relay 19 (step S40). In step S40, the converter control unit 13 controls the converter 17 such that the power supply line 102 is interrupted from the power supply line 202. As the converter 17 is controlled in this way, the power supply line 102 is interrupted from the power supply line 202, electric power of at least one of the power supply 103 and the battery 101 is supplied to the loads 111 to 127 in the load group 110 and the load 310.

In this way, when there occurs an abnormality in the circuit 200, the converter 17 is controlled such that the power supply line 102 is interrupted from the power supply line 202. Therefore, it is possible to stop flow of current between the power supply line 102 and the power supply line 202 via the converter 17, so it is possible to prevent the influence of an abnormality of the circuit 200 on the circuit 100.

For example, when the second under voltage fault where the voltage of the power supply line 202 is lower than the voltage of the battery 101 has been detected by the abnormality detection unit 12, the converter control unit 13 controls the converter 17 such that the power supply line 102 is interrupted from the power supply line 202. For example, the abnormality detection unit 12 detects an under voltage fault of the circuit 200 when the voltage of the power supply line 202 becomes lower by a predetermined amount of decrease than the voltage of the battery 101. In this case, the abnormality detection unit 12 estimates that there occurs a ground short circuit of the power supply line 202, an internal short circuit of any of the loads 211 to 220, or the like.

With step S40, even when there occurs the second under voltage fault in which the voltage of the power supply line 202 becomes lower than the voltage of the battery 101, it is possible to prevent migration of electric power from the power supply 103 and the electric charge of the battery 101 to the power supply line 202 via the converter 17. Therefore, it is possible to reduce the degree to which the amount of electric charge stored in the battery 101 reduces after the second under voltage fault has occurred in the circuit 200. As a result, it is possible to extend a time during which electric power for actuating the loads 120 to 127 is ensured by the battery 101 at the time when there occurs an abnormality in the circuit 200. In addition, even when the loads 211 to 219 malfunction because of an abnormality in the circuit 200, it is possible to extend a time during which the functions of the loads 211 to 219 are backed up by using the functions of the loads 120 to 127.

When an abnormality of the circuit 100 has been detected in step S10, the converter control unit 13 determines whether a predetermined delay time has elapsed from the detection of the abnormality of the circuit 100 (step S50). When the converter control unit 13 determines that the predetermined delay time has not elapsed from the detection of the abnormality of the circuit 100, the converter control unit 13 executes the process of step S60. When the converter control unit 13 determines that the predetermined delay time has elapsed from the detection of the abnormality of the circuit 100, the converter control unit 13 executes the process of step S70.

In step S60, the converter control unit 13 turns off the converter 17, turns on the relay 18 and turns on the relay 19 (step S60). Thus, the power supply line 102 is interrupted from the power supply line 202, and the electric power of the battery 201 is supplied to the loads 211 to 220 in the load group 210 and the load 310.

In this way, when there occurs an abnormality in the circuit 100, the converter 17 is controlled such that the power supply line 102 is interrupted from the power supply line 202. Thus, it is possible to stop flow of current between the power supply line 102 and the power supply line 202 via the converter 17, so it is possible to prevent the influence of an abnormality of the circuit 100 on the circuit 200.

For example, when the first under voltage fault in which the voltage of the power supply line 102 becomes lower than the voltage of the battery 201 has been detected by the abnormality detection unit 11, the converter control unit 13 controls the converter 17 such that the power supply line 102 is interrupted from the power supply line 202. For example, when the voltage of the power supply line 102 becomes lower by a predetermined amount of decrease than the voltage of the battery 201, the abnormality detection unit 11 detects an under voltage fault of the circuit 100. In this case, the abnormality detection unit 11 estimates that there occurs a ground short circuit of the power supply line 102, an internal short circuit of any of the loads 111 to 127, or the like.

With step S60, even when there occurs the first under voltage fault in which the voltage of the power supply line 102 becomes lower than the voltage of the battery 201, it is possible to prevent migration of the electric charge of the battery 201 to the power supply line 102 via the converter 17. Therefore, it is possible to reduce the degree to which the amount of electric charge stored in the battery 201 reduces after the first under voltage fault has occurred in the circuit 100. As a result, it is possible to extend a time during which electric power for actuating the loads 211 to 219 is ensured by the battery 201 at the time when there occurs an abnormality in the circuit 100. In addition, even when the loads 120 to 127 malfunction because of an abnormality in the circuit 100, it is possible to extend a time during which the functions of the loads 120 to 127 are backed up by using the functions of the loads 211 to 219.

In step S70, the converter control unit 13 turns off the converter 17, turns off the relay 18 and turns on the relay 19 (step S70). Thus, the power supply line 102 is interrupted from the power supply line 202, and the electric power of the battery 201 is supplied to the load 310 without being supplied to the loads 211 to 220 in the load group 210.

In this way, when an abnormality of the circuit 100 has been detected by the abnormality detection unit 11, the converter control unit 13 controls the relay 18 such that the node 207 is interrupted from the power supply line 202 before electric power for actuating the load 310 from the battery 201 becomes empty.

Thus, when there is an abnormality in the circuit 100, the relay 18 is controlled such that the node 207 is interrupted from the power supply line 202 before electric power for actuating the load 310 from the battery 201 becomes empty. Therefore, electric power for actuating the load 310 is ensured by the battery 201 before all the electric power of the battery 201 is consumed as electric power for actuating the loads 211 to 219. As a result, it is possible to extend the operating time of the load 310 as compared to a second operating time. This is particularly effective when the load 310 is more important than the loads 211 to 219.

For example, the load 310 includes the steering controller that controls the wheel steering angle of the vehicle 50 by steer-by-wire. In this case, even when there is an abnormality in the circuit 100, it is possible to particularly extend the operating time of the steering controller, so it is possible to ensure a time for moving the vehicle 50 to a safer place.

In this way, with the power supply system 1, the same or similar function of each of the loads 120 to 127 and the loads 211 to 219 to the function of the other one is a motion control function for controlling the motion of the vehicle 50. Thus, even when the motion control functions of the loads 120 to 127 malfunction because of an abnormality in the circuit 100, it is possible to back up the motion control functions of the loads 120 to 127 by using the motion control functions of the loads 211 to 219. On the other hand, even when the motion control functions of the loads 211 to 219 malfunction because of an abnormality in the circuit 200, it is possible to back up the motion control functions of the loads 211 to 219 by using the motion control functions of the loads 120 to 127.

FIG. 4 is a view that shows an example of the hardware configuration of the voltage controller. The voltage controller 10 includes the converter 17, the relay 18, the relay 19, shunt resistors 31, 32, an input circuit 33, a CPU 34, drivers 35, 36, a current detection unit 37, an overcurrent detection unit 38, a voltage detection unit 39, a signal input circuit 40, a ROM 41 and a RAM 42.

The converter 17 is a so-called H-bridge bidirectional regulator circuit including transistors 21 to 24 and an inductor 25. The converter 17 selectively performs the operation of converting the voltage of input electric power from the power supply line 102 and supplying the power supply line 202 with the output electric power after voltage conversion and the operation of converting the voltage of input electric power from the power supply line 202 and supplying the power supply line 102 with output electric power after voltage conversion.

When the on state of an ignition signal IG has been detected via the input circuit 33, the CPU 34 turns on the voltage conversion of the converter 17. When the off state of the ignition signal IG has been detected via the input circuit 33, the CPU 34 turns off the voltage conversion of the converter 17.

The current detection unit 37 detects a current flowing through the power supply line 102 with the use of the shunt resistor 31, and detects a current flowing through the power supply line 202 with the use of the shunt resistor 32. The voltage detection unit 39 detects the voltage of the power supply line 102 and the voltage of the power supply line 202, and detects the voltage of the battery 201 and the voltage of the load 310. The CPU 34 supplies a pulse width modulation signal based on the current detected by the current detection unit 37 and the voltage detected by the voltage detection unit 39 to the driver 35. Thus, the voltage conversion of the converter 17 is driven by the driver 35. When the current detected by the current detection unit 37 is detected as an overcurrent by the overcurrent detection unit 38, the CPU 34 turns off the converter 17. The CPU 34 turns on or off the relays 18, 19 with the use of the driver 36.

Figure 5:
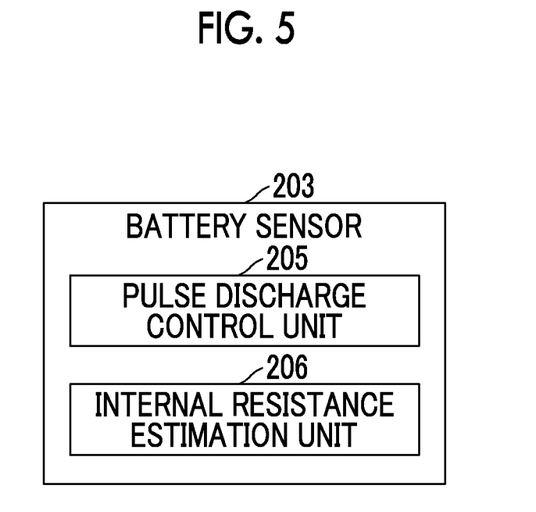
FIG. 5 is a view that shows an example of the functional configuration of a battery sensor.

FIG. 5 is a view that shows an example of the functional configuration of the battery sensor. The battery sensor 203 includes a pulse discharge control unit 205 and an internal resistance estimation unit 206. The pulse discharge control unit 205 controls pulse discharge of the battery 201. The internal resistance estimation unit 206 is an example of a second internal resistance estimation unit. The internal resistance estimation unit 206 estimates the internal resistance of the battery 201 by using a voltage difference and a current difference at the time of step-up/step-down operation of the battery 201 during pulse discharge by causing the battery 201 to carry out pulse discharge with the use of the pulse discharge control unit 205. Pulse discharge is to periodically repeat discharge of the battery 201 and stop of discharge.

The battery sensor 203, as well as FIG. 4, includes a central processing unit (CPU) that is an example of a processor, a read only memory (ROM) and a random access memory (RAM). The processing functions of the pulse discharge control unit 205 and internal resistance estimation unit 206 are implemented by the CPU when the CPU executes programs stored in the ROM. The programs include a program for causing the CPU to execute the procedure of processes. The RAM stores various data including intermediate data, and the like, in computation based on programs that the CPU executes.

The internal resistance estimation unit 206 transmits the estimated internal resistance to the degradation detection unit 16 of the voltage controller 10. The degradation detection unit 16 detects degradation of the battery 201 on the basis of the internal resistance estimated by the internal resistance estimation unit 15 and the internal resistance estimated by the internal resistance estimation unit 206. Thus, both the internal resistance estimated by the internal resistance estimation unit 15 and the internal resistance estimated by the internal resistance estimation unit 206 are considered in order to detect degradation of the battery 201, so the accuracy of detecting degradation of the battery 201 improves.

A degradation mode of the battery 201 includes a mode in which degradation is able to be detected on the basis of the internal resistance estimated by the internal resistance estimation unit 15 but degradation cannot be detected on the basis of the internal resistance estimated by the internal resistance estimation unit 206. On the other hand, there is a mode in which degradation cannot be detected on the basis of the internal resistance estimated by the internal resistance estimation unit 15 but degradation is able to be detected on the basis of the internal resistance estimated by the internal resistance estimation unit 206. Therefore, the degradation detection unit 16 is able to detect the degradation mode, which cannot be detected on the basis of the internal resistance estimated by the internal resistance estimation unit 15, on the basis of the internal resistance estimated by the internal resistance estimation unit 206. On the other hand, the degradation detection unit 16 is able to detect the degradation mode, which cannot be detected on the basis of the internal resistance estimated by the internal resistance estimation unit 206, on the basis of the internal resistance estimated by the internal resistance estimation unit 15.

The degradation mode of the battery 201 includes a mode in which degradation is able to be detected on the basis of the internal resistance estimated by the internal resistance estimation unit 15 and is also able to be detected on the basis of the internal resistance estimated by the internal resistance estimation unit 206. Therefore, the degradation detection unit 16 is able to highly accurately determine that the detected degradation mode is a degradation mode that is detectable with the use of any of the internal resistance estimation manners when degradation has been detected with the use of any of the internal resistance estimation manners.

The power supply system is described on the basis of the embodiment; however, the disclosure is not limited to the above-described embodiment. Various modifications and improvements, such as combinations and replacements with part or all of another embodiment, are applicable within the scope of the disclosure.

What is claimed is:

1. A power supply system comprising:
   a first circuit including a first power supply line connected to a first load, a power supply source connected to the first power supply line, and a first battery connected to the first power supply line;
   a second circuit including a second power supply line connected to a second load and a second battery connected to the second power supply line, the second load being configured to perform a function that substitutes for a function performed by the first load; and
   a voltage controller including:
      a direct current to direct current converter being connected between the first power supply line and the second power supply line,
      a first abnormality detection unit configured to detect an abnormality of the first circuit, and
      a converter control unit configured to:
         when the abnormality of the first circuit has not been detected by the first abnormality detection unit, control the direct current to direct current converter by using the input voltage from the first power supply line such that the output voltage higher than or equal to the voltage of the second battery is output to the second power supply line from the direct current to direct current converter, and
         when the abnormality of the first circuit has been detected by the first abnormality detection unit, control the direct current to direct current converter such that the first power supply line is interrupted from the second power supply line.

2. The power supply system according to claim 1, wherein the converter control unit is configured to, when a first under voltage fault in which a voltage of the first power supply line becomes lower than the voltage of the second battery has been detected by the first abnormality detection unit, control the direct current to direct current converter such that the first power supply line is interrupted from the second power supply line.

3. The power supply system according to claim 1, further comprising:
   a third power supply line connected between a third load and a node located between the second battery and the second power supply line; and
   a first interrupting mechanism connected between the node and the second power supply line, wherein
   the converter control unit is configured to, when the abnormality of the first circuit has been detected by the first abnormality detection unit, control the first interrupting mechanism such that the node is interrupted from the second power supply line before electric power for actuating the third load from the second battery becomes empty.

4. The power supply system according to claim 3, wherein the power supply system is mounted on a vehicle, and the third load includes a steering controller configured to control a wheel steering angle of the vehicle by steer-by-wire.

5. The power supply system according to claim 1, wherein the voltage controller includes a second abnormality detection unit configured to detect an abnormality of the second circuit, and
   the converter control unit is configured to, when the abnormality of the second circuit has been detected by the second abnormality detection unit, control the direct current to direct current converter such that the first power supply line is interrupted from the second power supply line.

6. The power supply system according to claim 5, wherein the converter control unit is configured to, when a second under voltage fault in which a voltage of the second power supply line becomes lower than a voltage of the first battery has been detected by the first abnormality detection unit, control the direct current to direct current converter such that the first power supply line is interrupted from the second power supply line.

7. The power supply system according to claim 1, wherein the output voltage is higher than or equal to the voltage of the second battery in a full charge state.

8. The power supply system according to claim 1, further comprising:
   a battery sensor configured to monitor the second battery; and
   a degradation detection unit configured to detect degradation of the second battery, wherein
   the voltage controller includes a first internal resistance estimation unit configured to estimate an internal resistance of the second battery by stepping up and stepping down the voltage of the second battery, the battery sensor includes a second internal resistance estimation unit configured to estimate an internal resistance of the second battery by causing the second battery to perform pulse discharge, and the degradation detection unit is configured to detect degradation of the second battery based on the internal resistance estimated by the first internal resistance estimation unit and the internal resistance estimated by the second internal resistance estimation unit.

9. The power supply system according to claim 1, wherein the first load and the second load each are configured to back up the other one by performing the same function as a function that the other one performs.

10. The power supply system according to claim 1, wherein the power supply system is mounted on a vehicle, and the first load and the second load each have a motion control function associated with control over a motion of the vehicle, and each are configured to back up the motion control function that the other one performs.

11. The power supply system according to claim 1, wherein the direct current to direct current converter is configured to output the output voltage to the second power supply line in accordance with control that is executed by the converter control unit.

12. The power supply system according to claim 1, wherein the first load and the second load each have a function of backing up a function of the other one.

* * * * *